US009356065B2

(12) United States Patent
Nam et al.

(10) Patent No.: US 9,356,065 B2
(45) Date of Patent: May 31, 2016

(54) IMAGE SENSOR HAVING IMPROVED LIGHT UTILIZATION EFFICIENCY

(71) Applicant: Samsung Electronics Co., Ltd., Suwon-Si, Gyeonggi-Do (KR)

(72) Inventors: Sunghyun Nam, Yongin-si (KR); Sookyoung Roh, Seoul (KR); Seokho Yun, Hwaseong-si (KR); Changgyun Shin, Anyang-si (KR); Hyungue Hong, Seoul (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 14/596,524

(22) Filed: Jan. 14, 2015

(65) Prior Publication Data
US 2015/0318318 A1 Nov. 5, 2015

(30) Foreign Application Priority Data

Apr. 30, 2014 (KR) .......................... 10-2014-0052983

(51) Int. Cl.
*H01L 31/0232* (2014.01)
*H01L 27/146* (2006.01)
*H01L 31/0216* (2014.01)

(52) U.S. Cl.
CPC ...... *H01L 27/1463* (2013.01); *H01L 27/14603* (2013.01); *H01L 27/14605* (2013.01); *H01L 27/14621* (2013.01); *H01L 27/14623* (2013.01); *H01L 27/14625* (2013.01); *H01L 27/14627* (2013.01); *H01L 27/14629* (2013.01); *H01L 27/14645* (2013.01); *H01L 31/02162* (2013.01)

(58) Field of Classification Search
CPC ................... H01L 27/14603; H01L 27/14605; H01L 27/14625; H01L 27/14627; H01L 31/02162
See application file for complete search history.

(56) References Cited

U.S. PATENT DOCUMENTS

| 5,926,238 | A * | 7/1999 | Inoue ................... G02B 27/108 250/330 |
|---|---|---|---|
| 2010/0309349 | A1 | 12/2010 | Kozlowski |
| 2011/0037869 | A1 | 2/2011 | Hiramoto et al. |
| 2011/0164156 | A1 | 7/2011 | Hiramoto et al. |
| 2011/0192962 | A1 * | 8/2011 | Nishiwaki ............ G02B 5/1871 250/226 |
| 2011/0279705 | A1 | 11/2011 | Kuang et al. |

(Continued)

FOREIGN PATENT DOCUMENTS

KR 20060093651 A 8/2006

OTHER PUBLICATIONS

Extended European Search Report dated Dec. 11, 2015.

*Primary Examiner* — Fei Fei Yeung Lopez
(74) *Attorney, Agent, or Firm* — Harness, Dickey & Pierce, P.L.C.

(57) ABSTRACT

An image sensor includes a first pixel row including a plurality of first pixels configured to sense first wavelength light, the first wavelength light having a first wavelength, a second pixel row adjacent to the first pixel row, the second pixel row including a plurality of second pixels configured to sense second wavelength light and a plurality of third pixels configured to sense third wavelength light, the plurality of second pixels and the plurality of third pixels being alternately arranged, the second wavelength light having a second wavelength and the third wavelength light having a third wavelength and a plurality of first color separation elements in the plurality of second pixels, respectively, the plurality of separation elements configured to change a spectrum distribution of incident light.

20 Claims, 8 Drawing Sheets

(56) References Cited

U.S. PATENT DOCUMENTS

| | | |
|---|---|---|
| 2012/0013777 A1 | 1/2012 | Mao et al. |
| 2012/0212656 A1* | 8/2012 | Hiramoto ......... H01L 27/14621 348/294 |
| 2012/0248561 A1 | 10/2012 | Hakko |
| 2013/0099343 A1 | 4/2013 | Toshikiyo et al. |
| 2014/0021574 A1 | 1/2014 | Egawa |
| 2014/0078355 A1 | 3/2014 | Hiramoto et al. |

* cited by examiner

IMAGE SENSOR HAVING IMPROVED LIGHT UTILIZATION EFFICIENCY

RELATED APPLICATIONS

This application claims the benefit of Korean Patent Application No. 10-2014-0052983, filed on Apr. 30, 2014, in the Korean Intellectual Property Office, the disclosure of which is incorporated herein in its entirety by reference.

BACKGROUND

1. Field

The present disclosure relates to image sensors, such as image sensors having an improved light utilization efficiency, by using a color separation element and a color filter.

2. Description of the Related Art

A color display apparatus or a color image sensor generally displays images of various colors or detects colors of incident light by using color filters. In a current color display device or a color image sensor, an RGB color filter mechanism is most popularly employed, in which, for example, green filters are arranged at two of four pixels and a blue filter and a red filter are respectively arranged at the other two pixels. Furthermore, other than the RGB color filter mechanism, a CYGM color filter mechanism may also be employed, in which cyan, yellow, green, and magenta color filters (complementary colors) are respectively arranged at four pixels.

However, a general absorption-type color filter absorbs lights of colors other than its own color, and thus light utilization efficiency may deteriorate. For example, in the case of using RGB color filters, only one-third of incident light is transmitted and two-thirds of the incident light is absorbed. Thus, light utilization efficiency is only about 33%. Therefore, in a color display apparatus or a color image sensor, most light loss occurs in color filters.

Recently, to improve light utilization efficiency of a color display apparatus or a color image sensor, there have been attempts to use a color separation element instead of color filters. A color separation element may separate colors of incident light by using a diffraction characteristic or a refraction characteristic that differs based on wavelengths, and colors separated by using the color separation element may be transmitted to pixels corresponding to the colors, respectively. However, a color separation element is still unable to provide images that are as clear as images provided by using color filters.

SUMMARY

According to an aspect, an image sensor includes a first pixel row including a plurality of first pixels configured to sense first wavelength light, the first wavelength light having a first wavelength, a second pixel row adjacent to the first pixel row, the second pixel row including a plurality of second pixels configured to sense second wavelength light and a plurality of third pixels configured to sense third wavelength light, the plurality of second pixels and the plurality of third pixels being alternately arranged, the second wavelength light having a second wavelength and the third wavelength light having a third wavelength, and a plurality of first color separation elements in the plurality of second pixels, respectively, the plurality of separation elements configured to change a spectrum distribution of incident light such that a ratio of the second wavelength light to light incident on the plurality of second pixels and a ratio of the third wavelength light to light incident on the plurality of third pixels increase.

The image sensor may further include a plurality of first microlenses on the plurality of first pixels, respectively, and a plurality of second microlenses disposed with respect to the plurality of second pixels, each of the plurality of second microlenses extending on areas of portions of the plurality of third pixels that are on two sides of the second pixels.

Each of the plurality of first pixels may include a first light detection device configured to convert the incident light into a first electrical signal, a first color filter on the light detection device, the first color filter configured to transmit through the first wavelength light, and a first transparent cover layer on the first color filter.

Each of the plurality of second pixels may include a second light detection device configured to convert the incident light into a second electrical signal, a second color filter on the second light detection device, the second color filter configured to transmit through the second wavelength light, and a second transparent cover layer on the second color filter.

Each of the plurality of third pixels may include a third light detection device configured to convert the incident light into a third electrical signal, a third color filter that on the third light detection device, the third color filter configured to transmit through the third wavelength light, and a third transparent cover layer disposed on the third color filter.

The first and second microlenses may be disposed on first, second and third transparent cover layers.

The plurality of first color separation elements may be fixedly embedded in at least one of the first, second and third transparent cover layers.

The plurality of first color separation elements are configured to transmit through the second wavelength light through a front surface of the first color separation elements toward the second pixels and refract the third wavelength light to edges of the first color separation elements toward the third pixels on two sides of the second pixels.

The first wavelength may be a green band, the second wavelength may be a blue band, and the third wavelength may be a red band.

The first wavelength may be a green band, the second wavelength may be a red band, and the third wavelength may be a blue band.

The first pixel row may be shifted with respect to the second pixel row by half the width of a pixel.

The first pixel row may further include a plurality of fourth pixels alternately arranged with the plurality of first pixels.

The first wavelength may be a magenta band, the second wavelength may be a cyan band, the third wavelength may be a yellow band, and the fourth wavelength may be a green band.

The first wavelength may be a magenta band, the second wavelength may be a yellow band, the third wavelength may be a cyan band, and the fourth wavelength may be a green band.

The image sensor may further include a plurality of second color separation elements disposed in the plurality of third pixels, respectively, the plurality of second color separation elements configured to change a spectrum distribution of incident light such that a ratio of the third wavelength light to the light incident on the third pixels and a ratio of the second wavelength light to the light incident on the second pixels increase.

The plurality of second color separation elements are configured to transmit through the third wavelength light through a front surface of the second color separation elements toward the third pixels and refract the second wavelength light to edges of the second color separation elements toward the second pixels on two sides of the third pixels.

The image sensor may further include a plurality of microlenses in, respectively, the plurality of first through third pixels.

According to another aspect, an image sensor includes a first pixel row including a first plurality of first pixels configured to sense first wavelength light and a plurality of second pixels configured to sense second wavelength light, the first plurality of first pixels and the plurality of second pixels being alternately arranged, the first wavelength light having a first wavelength and the second wavelength light having a second wavelength, a second pixel row adjacent to the first pixel row, the second pixel row including a second plurality of first pixels and a plurality of third pixels configured to sense third wavelength light, the second plurality of first pixels an the third plurality of pixels being alternately arranged, the third wavelength light having a third wavelength, and a plurality of first color separation elements in the plurality of second pixels, respectively, the plurality of first color separation elements configured to change a spectrum distribution of incident light such that a ratio of the second wavelength light to light incident on the plurality of second pixels and a ratio of the first wavelength light to light incident on at least one of the first and second pluralities of first pixels increase, and a plurality of second color separation elements that are respectively disposed in the plurality of third pixels, respectively, the plurality of second color separation elements change the spectrum distribution of the incident light such that a ratio of the third wavelength light to light incident on the plurality of third pixels and the ratio of the first wavelength light to the light incident on at least one of the first and second pluralities of first pixels increase.

The image sensor may further include a plurality of first microlenses disposed with respect to the plurality of second pixels and extending on areas of portions of the first pixels that are on two sides of the second pixels and a plurality of second microlenses disposed with respect to the third pixels and extending on areas of portions of the first pixels that are on two sides of the third pixels.

The plurality of first color separation elements are configured to transmit through the second wavelength light through a front surface of the first color separation elements toward the second pixels and refract the first wavelength light to edges of the first color separation elements toward the first pixels on two sides of each of the second pixels, and the plurality of second color separation elements are configured to transmit through the third wavelength light through a front surface of the second color separation elements toward the third pixels and refract the first wavelength light to edges of the second color separation elements toward the first pixels on two sides of the third pixels.

For example, the first wavelength may be a green band, the second wavelength may be a blue band, and the third wavelength may be a red band.

According to another aspect, an image sensor includes a first pixel row including a first plurality of first pixels configured to sense first wavelength light and a plurality of second pixels configured to sense second wavelength light, the first plurality of first pixels and the plurality of second pixels being alternately arranged, the first wavelength light having a first wavelength and the second wavelength light having a second wavelength, a second pixel row adjacent to the first pixel row, the second pixel row including a second plurality of first pixels and a plurality of third pixels configured to sense third wavelength light, the second plurality of first pixels and the third plurality of pixels being alternately arranged, the third wavelength light having a third wavelength, and a plurality of first color separation elements in the plurality of second pixels, respectively, the plurality of first color separation elements configured to change a spectrum distribution of incident light such that a ratio of the second wavelength light to light incident on the plurality of second pixels and a ratio of the first wavelength light to light incident on at least one of the first and second pluralities of first pixels increase, and a plurality of second color separation elements in the plurality of first pixels in the second pixel row, respectively, the plurality of second color separation elements configured to change the spectrum distribution of incident light such that the ratio of the first wavelength light to light incident on at least one of the first and second pluralities of first pixels and a ratio of the third wavelength light to light incident on the plurality of third pixels increase.

The image sensor may further include a plurality of first microlenses disposed with respect to the second pixels and extend on areas of portions of the first pixels that are on two sides of each of the second pixels and a plurality of second microlenses disposed with respect to the first pixels and extend on areas of portions of the third pixels that are on two sides of the first pixels.

For example, the first wavelength may be a green band, the second wavelength may be a blue band, and the third wavelength may be a red band.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
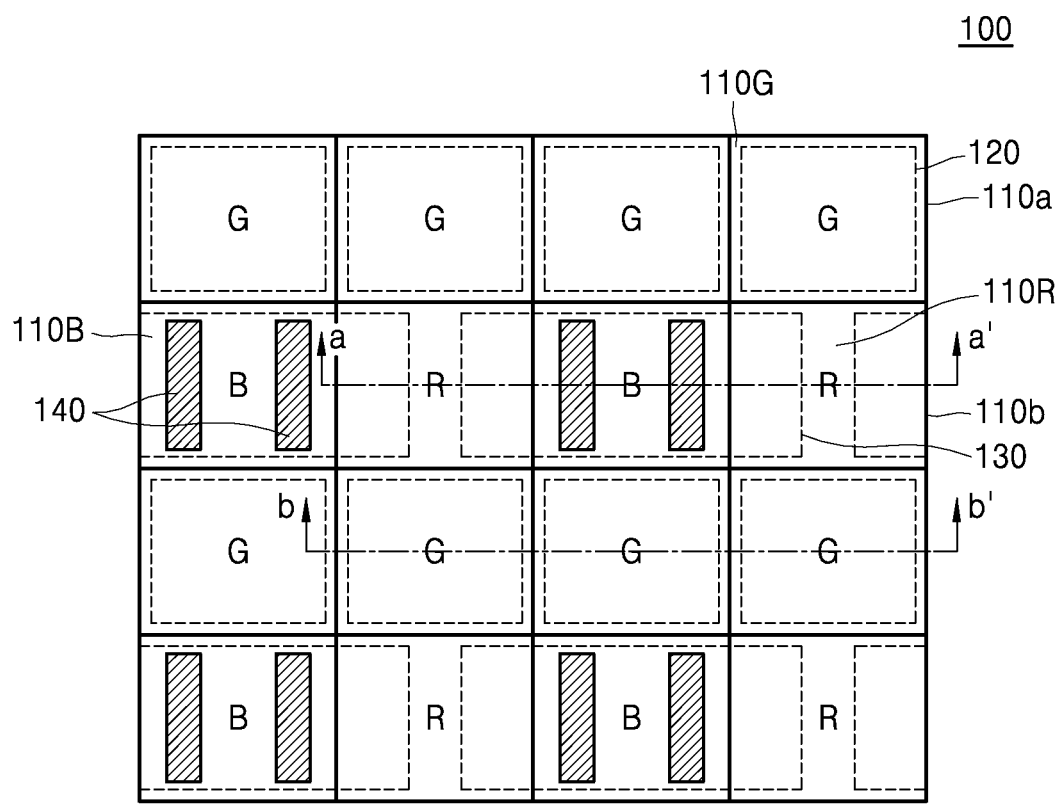
FIG. 1 is a schematic plan view of a pixel structure of an image sensor according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. It will also be understood that when a layer is referred to as being "on" another layer or substrate, it can be directly on the other layer or substrate, or intervening layers may also be present.

FIG. 1 is a schematic plan view of a pixel structure of an image sensor 100 according to an embodiment. Referring to FIG. 1, the image sensor 100 may include a pixel array in which a plurality of light detection pixels, that is, red pixels 110R, green pixels 110G, and blue pixels 110B are arranged in a two-dimensional matrix having a plurality of rows and a plurality of columns. For example, as illustrated in FIG. 1, only green pixels 110G may be arranged in a first pixel row 110a. Also, in a second pixel row 110b adjacent to the first pixel row 110a, red pixels 110R and blue pixels 110B may be alternately arranged. The first pixel row 110a and the second pixel row 110b may be alternately arranged in a vertical direction.

Figure 2:
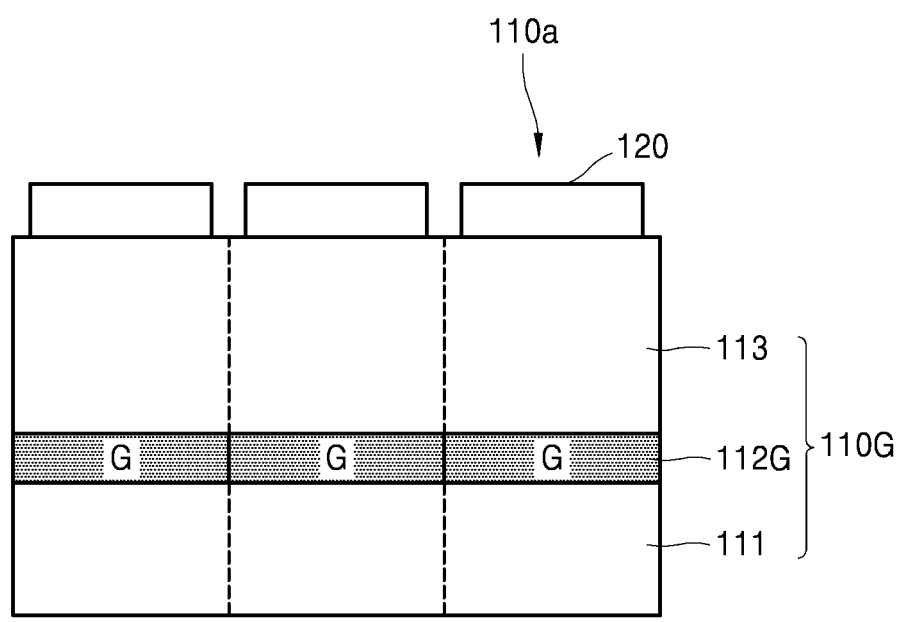
FIG. 2 is a cross-sectional view of the image sensor of FIG. 1, taken along line a-a'.

FIG. 2 is a cross-sectional view of the first pixel row 110a of the image sensor 100 of FIG. 1, taken along line a-a'. Referring to FIG. 2, the first pixel row 110a may include a plurality of light detection devices 111 that are arranged adjacent to one another, a plurality of green color filters 112G respectively disposed on light incident surfaces of the light detection devices 111, a transparent cover layer 113 disposed on all the green color filters 112G, and a plurality of microlenses 120 that are disposed on the transparent cover layer 113 so as to concentrate incident light onto each of the light detection devices 111. Each of the light detection devices 111, each of the green color filters 112G, and the transparent cover layer 113 may form one green pixel 110G.

In this structure, incident light may pass through the transparent cover layer 113 and the green color filters 112G via the microlenses 120 and be focused onto the light detection devices 111. The green color filters 112G may be respectively disposed on the light detection devices 111, or a single, large green color filter 112G may also be disposed on all of the light detection devices 111. As only the green color filters 112G are arranged in the first pixel row 110a, only green wavelength band light of incident light may pass through the green color filters 112G and be incident on the light detection devices 111. The light detection devices 111 convert the incident light into an electrical signal according to an intensity thereof. Thus, only green light may be detected by the first pixel row 110a.

Figure 3:
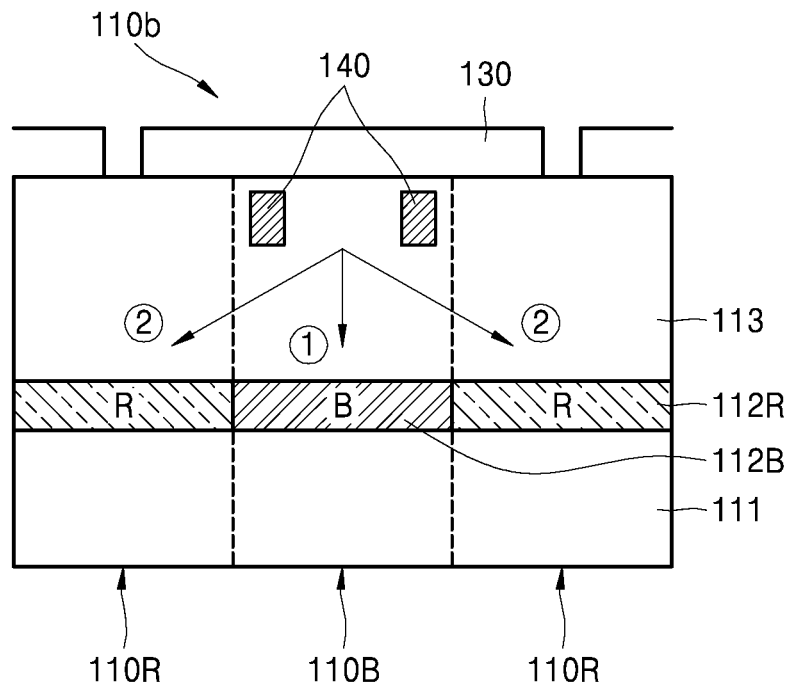
FIG. 3 is a cross-sectional view of the image sensor of FIG. 1, taken along line b-b'.

FIG. 3 is a cross-sectional view of the second pixel row 110b of the image sensor 100 of FIG. 1, taken along line b-b'. Referring to FIG. 3, the second pixel row 110b may include a plurality of light detection devices 111 that are arranged adjacent to one another, a plurality of red color filters 112R and a plurality of blue color filters 112G that are alternately disposed on light incident surfaces of the light detection devices 111 in correspondence to red pixels 110R and blue pixels 110B, a transparent cover layer 113 disposed on all the red and blue color filters 112R and 112B, a plurality of color separation elements 140 disposed in the transparent cover layer 113 to face the blue color filters 112B, and a plurality of microlenses 130 that are disposed on the transparent cover layer 113 so as to concentrate incident light onto each of the light detection devices 111. Each of the light detection devices 111, each of the blue color filters 112B, and the transparent cover layer 113 may form one blue pixel 110B, and each of the light detection devices 111, each of the red color filters 112B, and the transparent cover layer 113 may form one red pixel 110R. The color separation elements 140 may be fixed by being embedded in and surrounded by the transparent cover layer.

As illustrated in FIG. 3, the microlenses 130 may extend on an area of the blue pixel 110B and areas of portions of the red pixels 110R that are on two sides of the blue pixel 110B. In the first pixel row 110a, each of the microlenses 120 is disposed within one green pixel 110B, whereas each of the microlenses 130 of the second pixel row 110b is disposed on the blue pixel 110B and half portions of the red pixels 110R on two sides of the blue pixel 110B. That is, a width of the microlenses 130 of the second pixel row 110b may be about twice as large as a width of the microlenses 120 of the first pixel row 110a. Accordingly, light that is incident on the blue pixel 110B and portions of the red pixels 110R on two sides thereof may be concentrated via the microlenses 130 and pass through the color separation elements 140.

The color separation elements 140 separate colors of incident light by converting a light traveling path according to a wavelength of the incident light by using diffraction or refraction characteristics of light which vary according to wavelengths. The color separation elements 140 have various forms such as a transparent symmetrical or asymmetrical bar shape, or a prism shape having an inclination surface, which is well known in the art, and may be designed in various forms according to a desired spectrum distribution of exit light. According to the present embodiment, the color separation elements 140 may be designed to change a spectrum distribution of incident light such that a ratio of blue light is increased in light traveling to the blue color filter 112B, which the color separation elements 140 face, and a ratio of red light is increased in light traveling to the red color filter 112R on two sides of the blue color filter 112B.

Figure 4:
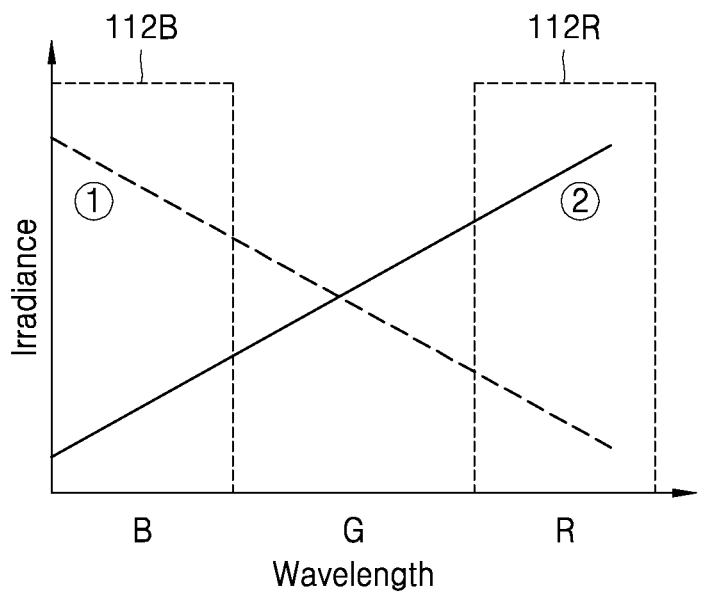
FIG. 4 is a schematic graph showing a color separation spectrum obtained by using a color separation element illustrated in FIG. 1.

For example, referring to FIG. 3, light indicated as '①' may pass through the color separation elements 140 without a change in a traveling path and reach the blue color filter 112B. Also, in FIG. 3, a traveling direction of light indicated as '②' may be obliquely changed toward edges of the color separation elements 140 to reach the red color filters 112R on two sides of the blue color filter 112B. FIG. 4 is a schematic graph showing a color separation spectrum obtained by using the color separation elements 140, wherein light indicated as '①' and light indicated as '①' are shown. Referring to FIG. 4, when typical white light is incident on the color separation elements 140, a ratio of a blue wavelength in the light indicated as '①' may increase while the light transmits through the color separation elements 140, and a ratio of a red wavelength may increase in the light indicated as '②' while the light transmits through the color separation elements 140. In FIG. 4, a dashed box indicated as 112R denotes an exemplary transmission band of the red color filter 112R, and a dashed box indicated as 112B denotes an exemplary transmission band of the blue color filter 112B.

According to the present embodiment, only about 33% of the incident light transmits through the green color filter 112G and reaches the light detection devices 111, like in a pixel structure according to the conventional art. On the other hand, as ratios of colors respectively corresponding to the blue color filter 112B and the red color filter 112R are high in the blue color filter 112B and the red color filter 112R, light transmissivity is higher than that of the pixel structure according to the conventional art. For example, about 50% of incident light or more transmits through the blue color filter 112B and the red color filter 112R, and the transmitted light is photoelectrically converted into an electrical signal representing an intensity of incident light of each pixel in the light detection devices 111. Accordingly, a light utilization efficiency of the blue color filter 112B and the red color filter 112R may be increased.

In general, an optical length of the color separation elements 140 in the image sensor 100 is only several micrometers or submicrometers, and thus, it is difficult to completely separate colors by only using the color separation elements 140. Accordingly, if just the color separation elements 140 are used, it is difficult to obtain high color purity. According to the present embodiment, by using the color separation elements 140 and the blue and red color filters 112B and 112R in combination, a predetermined and/or selected amount of color separation effect may be obtained by using the color separation elements 140 and high color purity may be obtained by using the blue and red color filters 112B and 112R, thereby increasing light utilization efficiency by reducing the amount of light energy that is absorbed by the blue and red color filters 112B and 112R and achieving high color purity at the same time.

Figure 5:
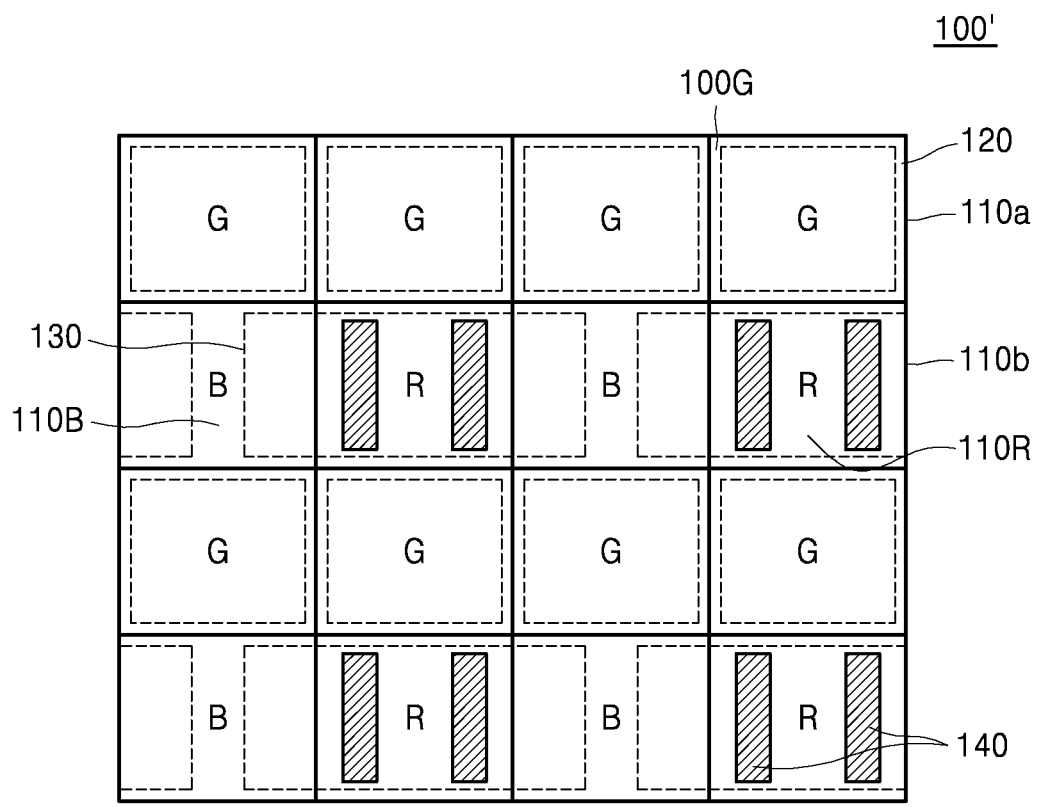
FIG. 5 is a schematic plan view of a pixel structure of an image sensor according to another embodiment.

FIG. 5 is a schematic plan view of a pixel structure of an image sensor 100' according to another embodiment. Compared to the image sensor 100 illustrated in FIG. 1, the image sensor 100' of FIG. 5 may be different from the image sensor 100 illustrated in FIG. 1 in that the color separation elements 140 are disposed in the red pixel 110R and the microlenses 130 are also disposed with respect to the red pixel 110R. The remaining structure of the image sensor 100' of FIG. 5 may be the same as that of the image sensor 100 illustrated in FIG. 1.

That is, the microlenses 130 may extend on an area of the red pixel 110R and areas of portions of the blue pixels 110B that are on the two sides of the red pixel 110R. For example, the microlenses 130 may be disposed over half portions of the blue pixels 110B that are on two sides of the red pixel 110R. Accordingly, light that is incident on the red pixel 110R and the portions of the blue pixels 110B that are on two sides of the red pixel 110R may be concentrated via the microlenses 130 and pass through the color separation elements 140 which are in the red pixel 110R.

The color separation elements 140 may be designed to change a spectrum distribution of incident light such that a ratio of red color in light traveling to the red color filter 112R, which the color separation elements 140 face, is increased, and a ratio of a blue color in light traveling to the blue color filter 112B on the two sides of the red color filter 112R is increased. For example, light that has transmitted through the color separation elements 140 without a change of a traveling path may reach the red color filter 112R, and light of which the traveling direction is obliquely changed toward edges of the color separation elements 140 reaches the blue color filter 112B on the two sides of the red color filter 112R. In this case, the color separation elements 140 may be designed such that light that reaches the red color filter 112R has a spectrum indicated as '②' in the graph of FIG. 4, and light that reaches the blue color filter 112B has a spectrum indicated as '①' in the graph of FIG. 4.

Figure 6:
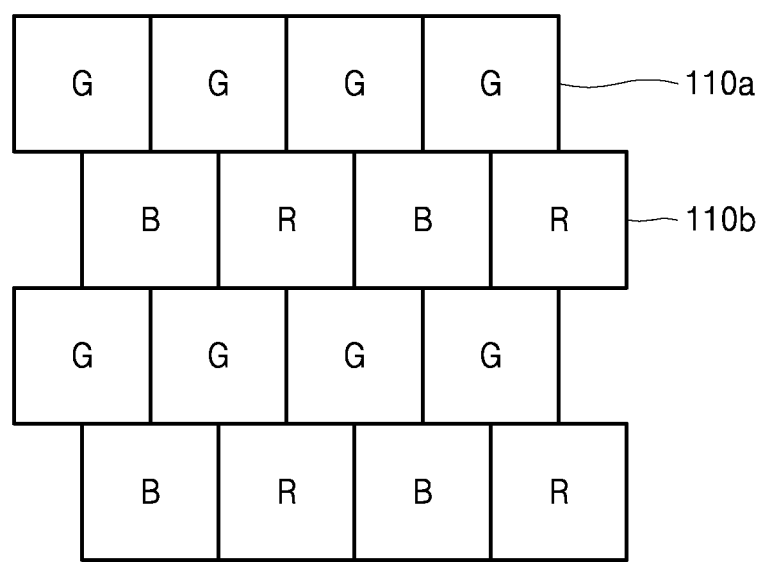
FIG. 6 is a schematic plan view of a pixel structure of an image sensor according to another embodiment.

FIG. 6 is a schematic plan view of a pixel structure of an image sensor according to another embodiment. While pixels of the first and second pixel rows 110a and 110b are coincidently arranged on the same lines in the image sensors 100 and 100' of FIGS. 1 and 5, pixels of the first and second pixel rows 110a and 110b in the image sensor of FIG. 6 may also be shifted with respect to each other. For example, the pixels of the first pixel row 110a may be shifted from the pixels of the second pixel row 110b by half the width of a pixel. Although not illustrated in FIG. 6, the color separation elements 140 may face the blue color filter 112B or the red color filter 112R of the second pixel row 110b. According to the embodiment of FIG. 6, the color separation elements 140 may face boundaries between two green pixels 110G of the first pixel row 110a that are adjacent to each other. In this case, even when a change in a spectrum due to the color separation elements 140 disposed in the second pixel row 110b affects the first pixel row 110a, the influence may be uniform on all green pixels 110G of the first pixel row 110a.

Figure 7:
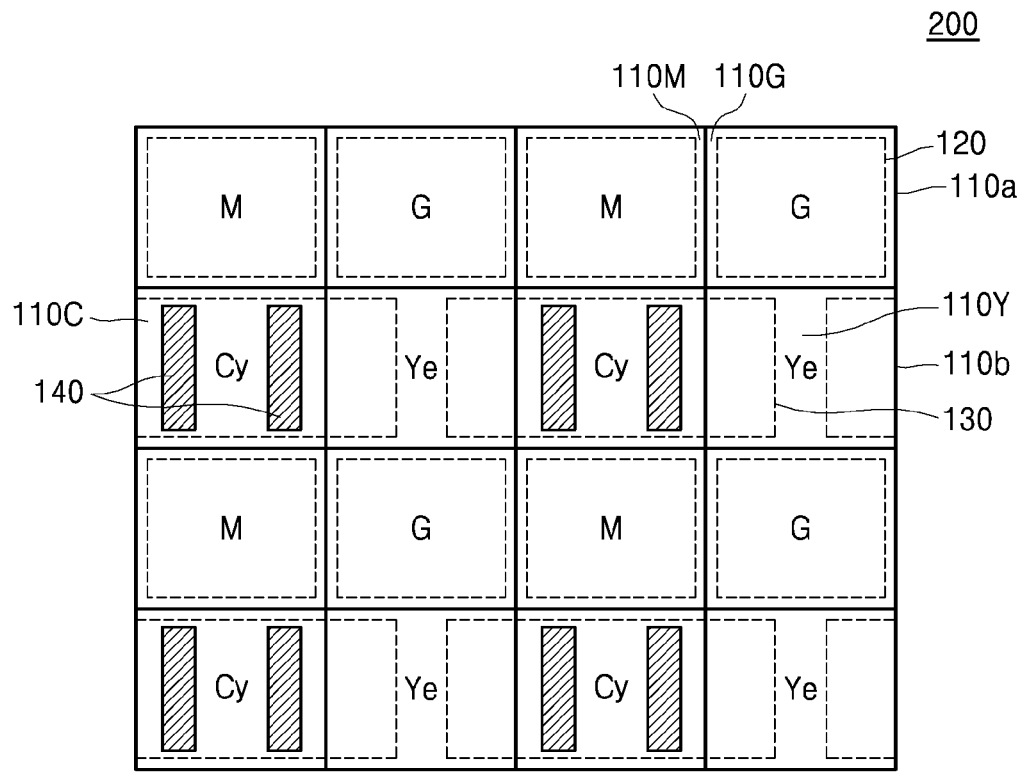
FIG. 7 is a schematic plan view of a pixel structure of an image sensor according to another embodiment.

FIG. 7 is a schematic plan view of a pixel structure of an image sensor 200 according to another embodiment. The image sensor 200 illustrated in FIG. 7 uses a CYGM color filter method in which cyan (Cy), yellow (Ye), green (G), and magenta (M) color filters are used, instead of the RGB color filter method described above. Referring to FIG. 7, a plurality of magenta pixels 110M and a plurality of green pixels 110G may be alternately arranged in a first pixel row 110a. Also, a plurality of cyan pixels 110C and a plurality of yellow pixels 110Y may be alternately arranged in a second pixel row 110b. The color separation elements 140 may be disposed in the cyan pixels 110C, and a plurality of microlenses 130 may also be disposed with respect to the cyan pixels 110C.

For example, the microlenses 130 may extend on an area of the cyan pixel 110C and areas of portions of the yellow pixels 110Y that are on the two sides of the cyan pixel 110C. As illustrated in FIG. 7, the microlenses 130 may be disposed over half portions of the yellow pixels 110Y that are on two sides of the cyan pixel 110C. Accordingly, light that is incident on the cyan pixel 110C and the portions of the yellow pixels 110Y that are on two sides of the cyan pixel 110C may be concentrated via the microlenses 130 and pass through the color separation elements 140, which are in the cyan pixel 110C.

The color separation elements 140 may be designed to change a spectrum distribution of incident light such that a ratio of cyan light in light traveling to the cyan pixel 110C is increased and a ratio of yellow light in light traveling to the yellow pixel 110Y on the two sides of the cyan pixel 110C is increased. For example, light that has transmitted through the color separation elements 140 without a change of a traveling path may reach a cyan color filter, and light of which the traveling direction is obliquely changed toward edges of the color separation elements 140 reaches a yellow color filter on the two sides of the cyan color filter. In this case, the color separation elements 140 may be designed such that the light that reaches the cyan color filter has a spectrum indicated as '①' in the graph of FIG. 4, and light that reaches the yellow color filter has a spectrum indicated as '②' in the graph of FIG. 4. According to the CYGM color filter scheme illustrated in FIG. 7, each color filter allows light to transmit through a broader wavelength band than an RGB color filter scheme, and thus absorption loss may be further reduced to thereby improve light utilization efficiency.

Figure 8:
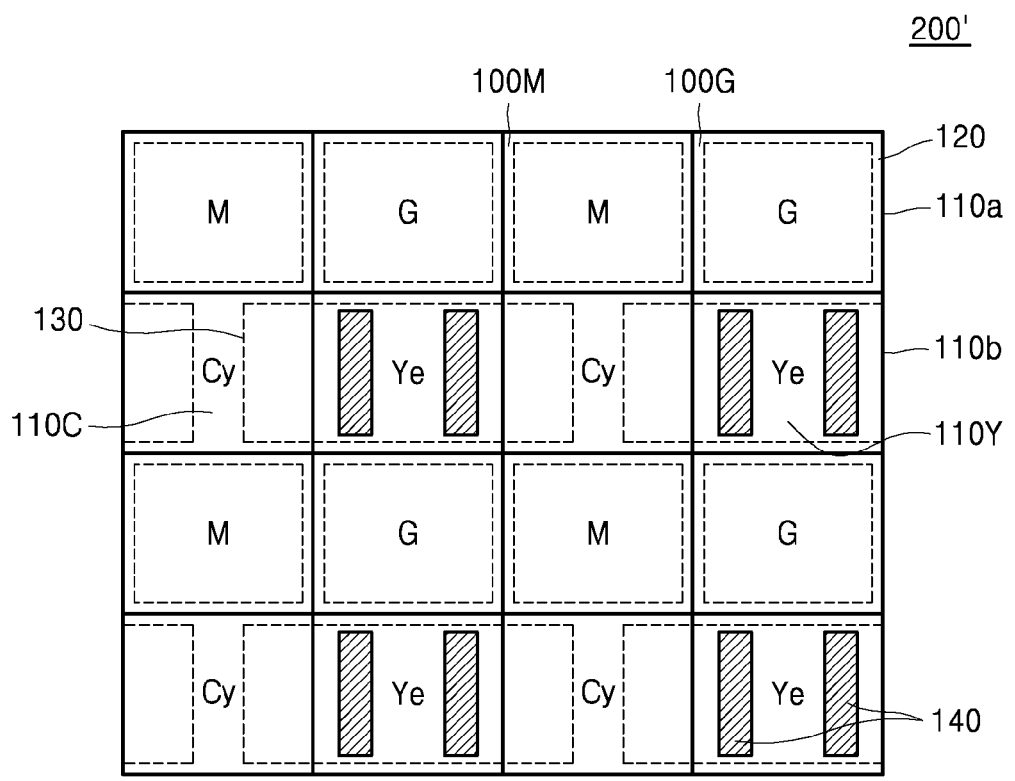
FIG. 8 is a schematic plan view of a pixel structure of an image sensor according to another embodiment.

FIG. 8 is a schematic plan view of a pixel structure of an image sensor 200' according to another embodiment. Compared to the image sensor 200 illustrated in FIG. 7, the image sensor 200' illustrated in FIG. 8 is different from the image sensor 200 illustrated in FIG. 7 in that the color separation elements 140 are disposed in the yellow pixel 110Y and the microlenses 130 are also disposed with respect to the yellow pixel 110Y. Accordingly, in the image sensor 200' illustrated in FIG. 8, the color separation elements 140 may be designed to increase a ratio of yellow light in light that has transmitted through the color separation elements 140 without a change of a traveling path and increase a ratio of cyan light in light of which the traveling direction is obliquely changed toward edges of the color separation elements 140. The remaining structure of the image sensor 200' of FIG. 8 is the same as that of the image sensor 200 illustrated in FIG. 7.

Figure 9:
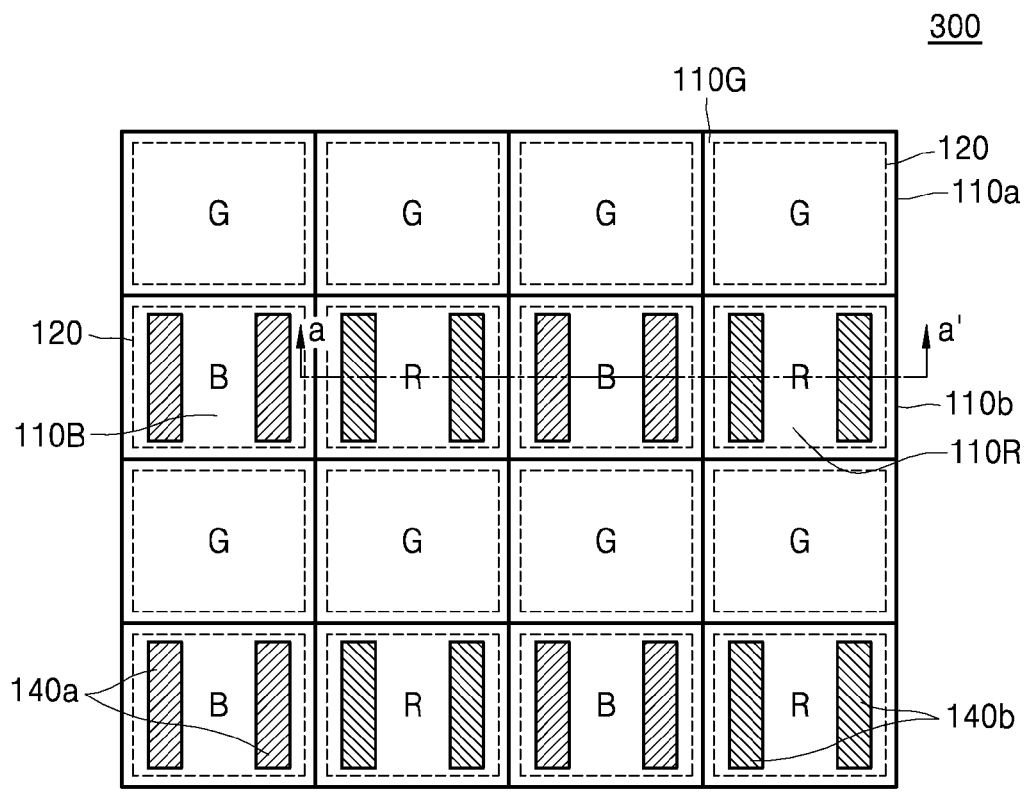
FIG. 9 is a schematic plan view of a pixel structure of an image sensor according to another embodiment.

FIG. 9 is a schematic plan view of a pixel structure of an image sensor 300 according to another embodiment. Like the image sensor 100 illustrated in FIG. 1, the image sensor 300 illustrated in FIG. 9 may include a first pixel row 110a having a plurality of green pixels 110G and a second pixel row 110b having a plurality of blue pixels 110B and a plurality of red pixels 110R that are alternately arranged. Compared to the image sensor 100 illustrated in FIG. 1, the image sensor 300 illustrated in FIG. 9 is different from the image sensor 100 illustrated in FIG. 1 in that one microlens 120 and one first color separation element 140a are disposed in each of the blue pixels 110B and one microlens 120 and one second color separation element 140b are disposed in each of the red pixels 110R. Thus, the microlenses 120 having the same structure may be used in all pixels, that is, the red pixels 110R, the green pixels 110G, and the blue pixels 110B in the image sensor 300 illustrated in FIG. 9.

Figure 10:
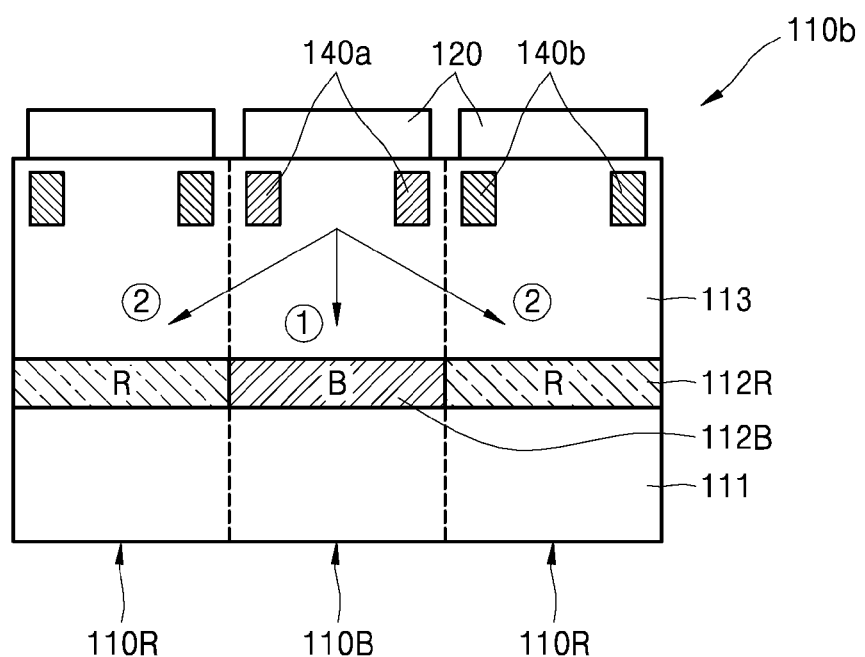
FIG. 10 is a cross-sectional view of the image sensor of FIG. 9, taken along line a-a'.

FIG. 10 is a cross-sectional view of the second pixel row 110b of the image sensor 300 of FIG. 9, taken along line a-a'. Referring to FIG. 10, the second pixel row 110b may include a plurality of light detection devices 111 that are arranged adjacent to one another, a plurality of red color filters 112R and a plurality of blue color filters 112B that are alternately disposed on light incident surfaces of the light detection devices 111, respectively, a transparent cover layer 113 disposed on the red and blue color filters 112R and 112B, the plurality of first color separation elements 140a disposed in the transparent cover layer 113 to face the blue color filters 112B, the plurality of second color separation elements 140b disposed in the transparent cover layer 113 to face the red color filters 112R, and the plurality of microlenses 120 that are disposed on the transparent cover layer 113 so as to concentrate incident light onto each of the light detection devices 111. The plurality of microlenses 120 may be disposed to respectively face the plurality of red and blue color filters 112R and 112B.

The first color separation element 140a may change a spectrum distribution of the incident light such that a ratio of a blue color in light traveling to the blue color filters 112B, which the first color separation elements 140a face, is increased and that a ratio of a red color in light traveling to the red color filters 112R on two sides of the blue color filter 112B is increased. Also, the second color separation element 140b may change a spectrum distribution of the incident light such that a ratio of a red color in light traveling to the red color filter 112R, which the second color separation elements 140b face, is increased and a ratio of a blue color in light traveling to the blue color filter 112B on two sides of the red color filter 112R is increased. For example, light that transmits through the first color separation element 140a and travels in a direction indicated as '①' may have a spectrum distribution indicated as '①' in FIG. 4, and light that transmits through the first color separation element 140a and travels in a direction indicated as '②' may have a spectrum distribution indicated as '②' in FIG. 4. Also, light that transmits through the second color separation element 140b and travels in a direction indicated as '③' may have a spectrum distribution indicated as '②' in FIG. 4, and light that transmits through the second color separation element 140b and travels in a direction indicated as '④' may have a spectrum distribution indicated as '①' in FIG. 4.

Figure 11:
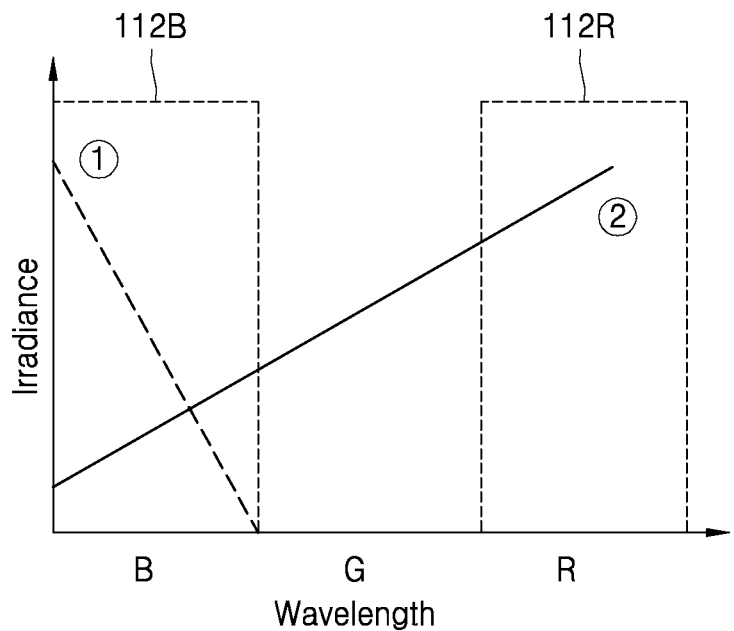
FIGS. 11 and 12 are schematic graphs respectively showing color separation spectrums obtained by using two color separation elements illustrated in FIG. 9.
Figure 12:
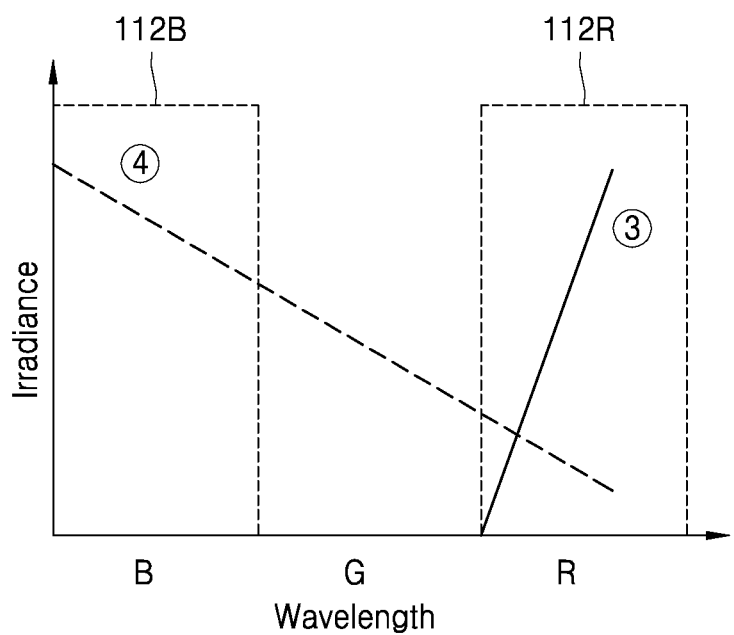

In order to further improve a light utilization efficiency of the image sensor 300, the first and second color separation elements 140a and 140b may have color separation spectrums as illustrated in FIGS. 11 and 12. For example, referring to FIG. 11, blue light may be distributed mostly in the light that transmits through the first color separation element 140a and travels in a direction indicated as '①'. In addition, a spectrum of the light that transmits through the first color separation element 140a and travels in a direction indicated as '②' may be the same as a spectrum distribution indicated as '②' in FIG. 11. In addition, referring to FIG. 12, red light may be distributed mostly in the light that transmits through the second color separation element 140b and travels in a direction indicated as '③'. Also, a spectrum of light that transmits through the second color separation element 140b and travels in a direction indicated as '④' may be the same as a spectrum distribution indicated as '④' in FIG. 12.

Figure 13:
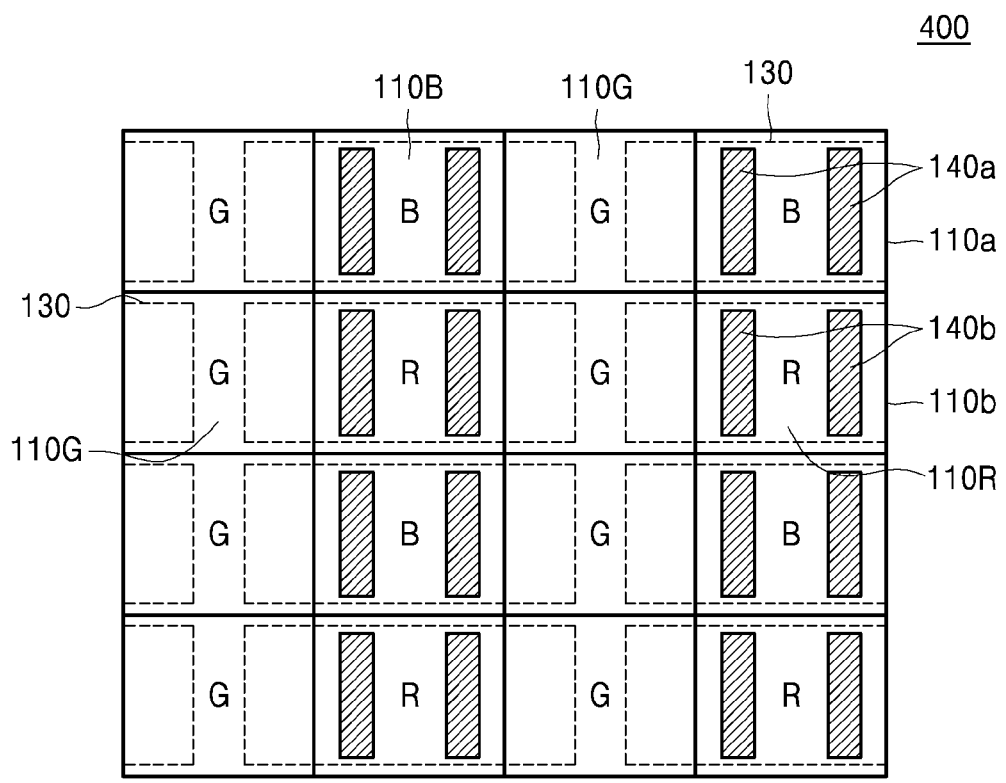
FIG. 13 is a schematic plan view of a pixel structure of an image sensor according to another embodiment.

FIG. 13 is a schematic plan view of a pixel structure of an image sensor 400 according to another embodiment. The image sensor 400 illustrated in FIG. 13 may include a first pixel row 110a having a plurality of green pixels 110G and a plurality of blue pixels 110B that are alternately arranged, a second pixel row 110b having a plurality of green pixels 110G and a plurality of red pixels 110R that are alternately arranged, a plurality of first color separation elements 140a disposed to respectively face the plurality of blue color filters 112B, and a plurality of second color separation elements 140b disposed to respectively face the plurality of red color filters 112R.

In addition, microlenses 130 having the same structure may be arranged with respect to the blue pixels 110B and the red pixels 110R. For example, the microlenses 130 may extend in the first pixel row 110a on an area of the blue pixel 110B and areas of portions of the green pixels 110G that are on two sides of the blue pixel 110B. Accordingly, light that is incident on the blue pixel 110B and the portions of the green pixels 110G that are on the two sides thereof may be concentrated via the microlenses 130 of the first pixel row 110a and pass through the first color separation elements 140a. Also, the microlenses 130 may extend in the second pixel row 110b on an area of the red pixel 110R and areas of portions of the green pixels 110G that are on two sides of the red pixel 110R. Accordingly, light that is incident on the red pixel 110R and the portions of the green pixels 110G that are on the two sides thereof may be concentrated via the microlenses 130 of the second pixel row 110b and pass through the second color separation element 140b.

The first color separation elements 140a may change a spectrum distribution of incident light such that a ratio of a blue color in light traveling to the blue pixel 110B, which the first color separation elements 140a face, is increased and that a ratio of a green color in light traveling to the green pixel 110G on two sides of the red pixel 110R is increased. Also, the second color separation elements 140b may change a spectrum distribution of the incident light such that a ratio of a red color in light traveling to the red pixel 110R, which the second color separation elements 140b face, is increased and that a ratio of a green color in light traveling to the green pixel 110G on two sides thereof is increased. For example, the light that transmits through the first color separation elements 140a and travels toward the blue pixel 110B may have a spectrum distribution indicated as '①' in FIG. 4, and the light that transmits through the first color separation elements 140a and travels toward the green pixel 110G may have a spectrum distribution indicated as '②' in FIG. 4. Also, the light that transmits through the second color separation elements 140b and travels toward the red pixel 110R may have a spectrum distribution indicated as '②' in FIG. 4, and the light that transmits through the second color separation elements 140b and travels toward the green pixel 110G may have a spectrum distribution indicated as '①' in FIG. 4. Accordingly, according to the image sensor 400 of the current embodiment, light utilization efficiency may also be improved with respect to green light.

Figure 14:
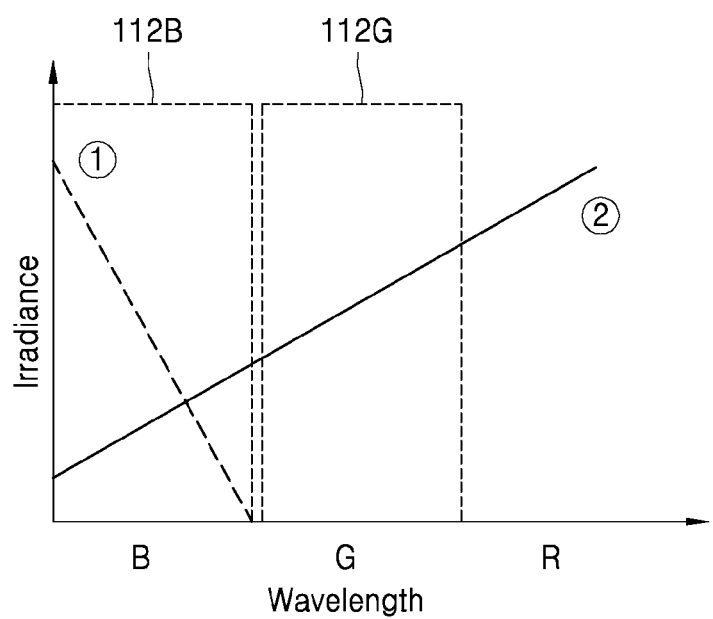
FIGS. 14 and 15 are schematic graphs respectively showing color separation spectrums obtained by two color separation elements illustrated in FIG. 13.
Figure 15:
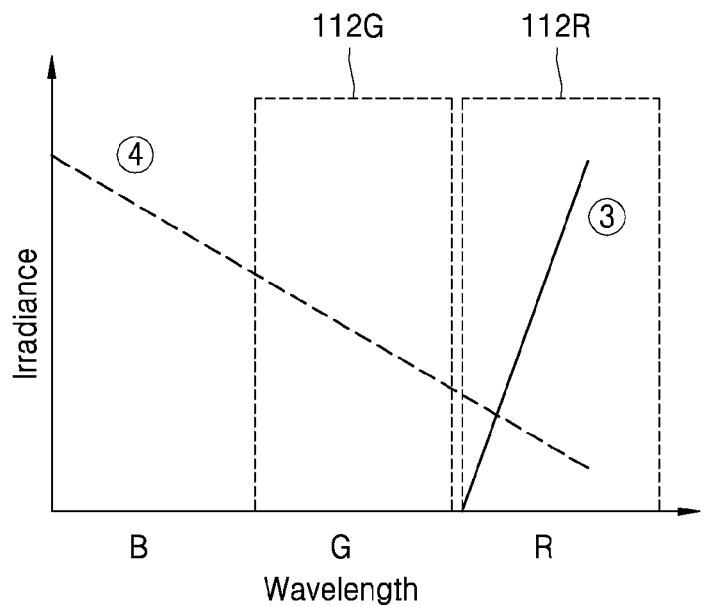

In order to further improve a light utilization efficiency of the image sensor 400, the first and second color separation elements 140a and 140b may have color separation spectrums illustrated in FIGS. 14 and 15. For example, referring to FIG. 14, the light that transmits through the first color separation elements 140a and travels toward the blue pixel 110B may have a spectrum distribution indicated as '①', and the light that transmits through the first color separation elements 140a and travels toward the green pixel 110G may have a spectrum distribution indicated as '②'. Also, referring to FIG. 15, the light that transmits through the second color separation element 140b and travels toward the red pixel 110R may have a spectrum distribution indicated as '③', and the light that transmits through the second color separation element 140b and travels toward the green pixel 110G may have a spectrum distribution indicated as '④'. In FIGS. 14 and 15, a dashed box indicated as 112R denotes an exemplary transmission band of the red color filter 112R, and a dashed box indicated as 112B denotes an exemplary transmission band of the blue color filter 112B, and a dashed box indicated as 112G denotes an exemplary transmission band of the green color filter 112G.

Figure 16:
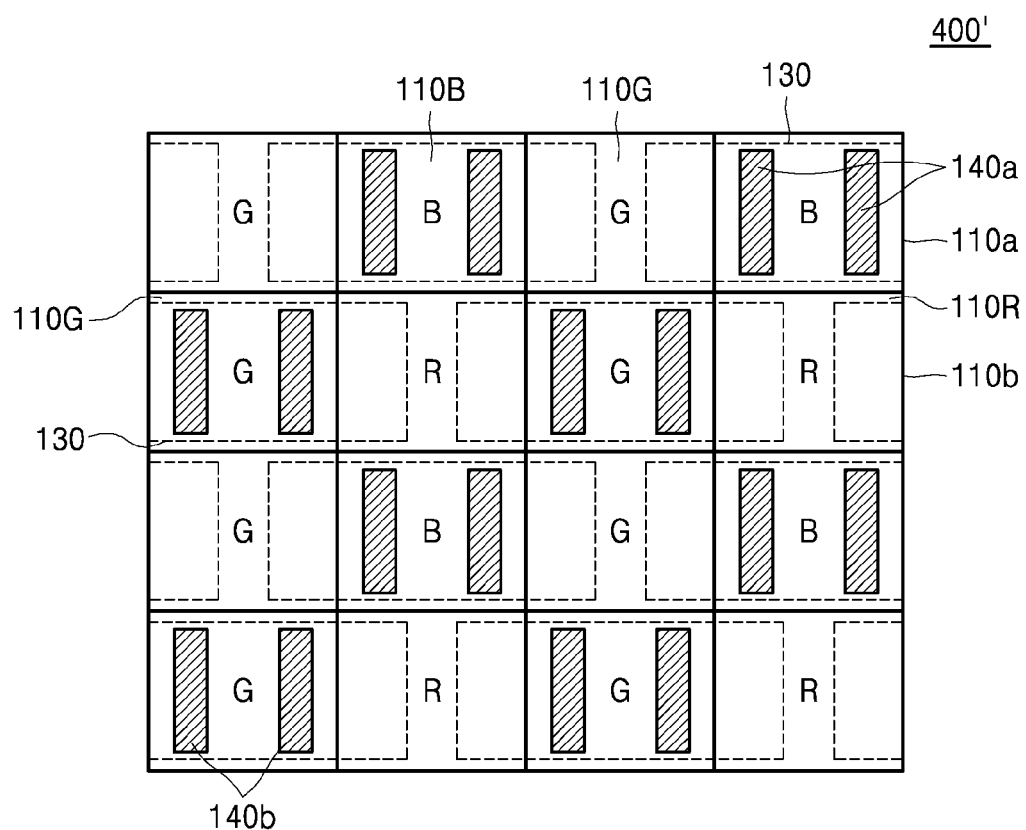
FIG. 16 is a schematic plan view of a pixel structure of an image sensor according to another embodiment.

FIG. 16 is a schematic plan view of a pixel structure of an image sensor 400' according to another embodiment. The image sensor 400' illustrated in FIG. 16 may include a first pixel row 110a having a plurality of green pixels 110G and a plurality of blue pixels 110B that are alternately arranged, a second pixel row 110b having a plurality of green pixels 110G and a plurality of red pixels 110R that are alternately arranged, a plurality of first color separation elements 140a disposed to respectively face the plurality of blue color filters 112B, and a plurality of second color separation elements 140b disposed to respectively face the plurality of green color filters 112G. Compared to the image sensor 400 illustrated in FIG. 13, the image sensor 400' illustrated in FIG. 16 is different from the image sensor 400 illustrated in FIG. 13 in that the plurality of second color separation elements 140b are disposed in the plurality of green pixels 110G. Also, in the second pixel row 110b, microlenses 130 may extend on an area of the green pixel 110G and areas of portions of the red pixels 110R that are on two sides of the green pixel 110G.

The first color separation elements 140a may increase a ratio of a blue color in light traveling to the blue pixel 110B, which the first color separation elements 140a face, and increase a ratio of a green color in light traveling to the green pixel 110G on two sides of the blue pixel 110B. Also, the second color separation elements 140b may increase a ratio of a green color in light traveling to the green pixel 110G, which the second color separation elements 140b face, and increase a ratio of a red color in light traveling to the red pixels 110R on two sides of the green pixel 110G. According to the present embodiment, the first and second color separation elements 140a and 140b may have the same structure. For example, the light that transmits through the first color separation elements 140a and travels toward the blue pixel 110B may have a spectrum distribution indicated as '①' in FIG. 4, and the light that transmits through the first color separation elements 140a and travels toward the green pixel 110G may have a spectrum distribution indicated as '②' in FIG. 4. Also, the light that transmits through the second color separation elements 140b and travels toward the green pixel 110G may have a spectrum distribution indicated as '①' in FIG. 4, and the light that transmits through the second color separation elements 140b and travels toward the red pixel 110R may have a spectrum distribution indicated as '②' in FIG. 4.

In general, a color separation element may operate efficiently when short-wavelength light is transmitted through a front surface thereof and long-wavelength light is refracted through an edge thereof, compared to the other way around. Accordingly, a light utilization efficiency of the image sensor 400' having a structure in which the second color separation elements 140b are disposed in the green pixel 110G in the second pixel row 110b may be further improved.

The first color separation elements 140a and the second color separation elements 140b may have different structures. For example, light that transmits through the first color separation elements 140a and travels toward the blue pixel 110B may have a spectrum distribution indicated as '①' in FIG. 14, and light that transmits through the first color separation elements 140a and travels toward the green pixel 110G may have a spectrum distribution indicated as '②' in FIG. 14. Also, light that transmits through the second color separation elements 140b and travels toward the green pixel 110G may have a spectrum distribution indicated as '④' in FIG. 15, and light that transmits through the second color separation elements 140b and travels toward the red pixel 11OR may have a spectrum distribution indicated as '③' in FIG. 15.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:
1. An image sensor comprising:
a first pixel row including a plurality of first pixels configured to sense first wavelength light, the first wavelength light having a first wavelength;
a second pixel row adjacent to the first pixel row, the second pixel row including a plurality of second pixels configured to sense second wavelength light and a plurality of third pixels configured to sense third wavelength light, the plurality of second pixels and the plurality of third pixels being alternately arranged, the second wavelength light having a second wavelength and the third wavelength light having a third wavelength; and
a plurality of first color separation elements in the plurality of second pixels, respectively, the plurality of separation elements configured to change a spectrum distribution of incident light such that a ratio of the second wavelength light to light incident on the plurality of second pixels and a ratio of the third wavelength light to light incident on the plurality of third pixels increase,
wherein the first pixel row includes only the first pixels among the first pixels, the second pixels and the third pixels,
the first pixels of the first pixel row are configured to sense light having the same wavelength band, and
there is no color separation element in the first pixels of the first pixel row.
2. The image sensor of claim 1, further comprising a plurality of first microlenses on the plurality of first pixels, respectively, and a plurality of second microlenses disposed with respect to the plurality of second pixels, each of the plurality of second microlenses extending on areas of portions of the plurality of third pixels that are on two sides of the second pixels.

3. The image sensor of claim 2, wherein
each of the plurality of first pixels comprises a first light detection device configured to convert the incident light into a first electrical signal, a first color filter on the light detection device, the first color filter configured to transmit through the first wavelength light, and a first transparent cover layer on the first color filter, and
each of the plurality of second pixels comprises a second light detection device configured to convert incident light into a second electrical signal, a second color filter on the second light detection device, the second color filter configured to transmit through the second wavelength light, and a second transparent cover layer on the second color filter, and
each of the plurality of third pixels comprises a third light detection device configured to convert the incident light into a third electrical signal, a third color filter that on the third light detection device, the third color filter configured to transmit through the third wavelength light, and a third transparent cover layer disposed on the third color filter.

4. The image sensor of claim 3, wherein the first and second microlenses are disposed on first, second and third transparent cover layers.

5. The image sensor of claim 3, wherein the plurality of first color separation elements are fixedly embedded in at least one of the first, second and third transparent cover layers.

6. The image sensor of claim 1, wherein the plurality of first color separation elements are configured to transmit through the second wavelength light through a front surface of the first color separation elements toward the second pixels and refract the third wavelength light to edges of the first color separation elements toward the third pixels on two sides of the second pixels.

7. The image sensor of claim 1, wherein the first wavelength is a green band, the second wavelength is a blue band, and the third wavelength is a red band.

8. The image sensor of claim 1, wherein the first wavelength is a green band, the second wavelength is a red band, and the third wavelength is a blue band.

9. The image sensor of claim 1, wherein the first pixel row is shifted with respect to the second pixel row by half the width of a pixel.

10. The image sensor of claim 1, wherein the first pixel row further comprises a plurality of fourth pixels alternately arranged with the plurality of first pixels.

11. The image sensor of claim 10, wherein the first wavelength is a magenta band, the second wavelength is a cyan band, the third wavelength is a yellow band, and the fourth wavelength is a green band.

12. The image sensor of claim 10, wherein the first wavelength is a magenta band, the second wavelength is a yellow band, the third wavelength is a cyan band, and the fourth wavelength is a green band.

13. The image sensor of claim 1, further comprising a plurality of second color separation elements in the plurality of third pixels, respectively, the plurality of second color separation elements configured to change a spectrum distribution of incident light such that a ratio of the third wavelength light to the light incident on the third pixels and a ratio of the second wavelength light to the light incident on the second pixels increase.

14. The image sensor of claim 13, wherein the plurality of second color separation elements are configured to transmit through the third wavelength light through a front surface of the second color separation elements toward the third pixels and refract the second wavelength light to edges of the second color separation elements toward the second pixels on two sides of each of the third pixels.

15. The image sensor of claim 13, further comprising a plurality of microlenses in, respectively, the plurality of first through third pixels.

16. An image sensor comprising:
a first pixel row including a first plurality of first pixels configured to sense first wavelength light and a plurality of second pixels configured to sense second wavelength light, the first plurality of first pixels and the plurality of second pixels being alternately arranged, the first wavelength light having a first wavelength and the second wavelength light having a second wavelength;
a second pixel row adjacent to the first pixel row, the second pixel row including a second plurality of first pixels and a plurality of third pixels configured to sense third wavelength light, the second plurality of first pixels and the plurality of third pixels being alternatively arranged, the third wavelength light having a third wavelength; and
a plurality of first color separation elements in the plurality of second pixels, respectively, the plurality of first color separation elements configured to change the spectrum distribution of the incident light such that a ratio of the second wavelength light to light incident on the plurality of second pixels and a ratio of the first wavelength light to light incident on at least one of the first and second pluralities of first pixels increase; and
a plurality of second color separation elements in the plurality of third pixels, respectively, the plurality of second color separation elements configured to change the spectrum distribution of the incident light such that a ratio of the third wavelength light to light incident on the plurality of third pixels and the ratio of the first wavelength light to the light incident on the at least one of the first and second pluralities of first pixels increase,
wherein the first pixels of the first pixel row and the first pixels of the second pixel row are configured to sense light having the same wavelength band, and
there is no color separation element in the first pixels of the first pixel row and in the first pixels of the second pixel row.

17. The image sensor of claim 16, further comprising a plurality of first microlenses disposed with respect to the plurality of second pixels and extending on areas of portions of the first pixels that are on two sides of the second pixels and a plurality of second microlenses disposed with respect to third pixels and extending on areas of portions of the first pixels that are on two sides of the third pixels.

18. The image sensor of claim 16, wherein the plurality of first color separation elements are configured to transmit through the second wavelength light through a front surface of the first color separation elements toward the second pixels and refract the first wavelength light to edges of the first color separation elements toward the first pixels on two sides of the second pixels, and the plurality of second color separation elements are configured to transmit through the third wavelength light through a front surface of the second color separation elements toward the third pixels and refract the first wavelength light to edges of the second color separation elements toward the first pixels on two sides of the third pixels.

19. An image sensor comprising:
a first pixel row including a first plurality of first pixels configured to sense first wavelength light and a plurality of second pixels configured to sense second wavelength light, the first plurality of first pixels and the plurality of second pixels being alternately arranged, the first wavelength light having a first wavelength and the second wavelength light having a second wavelength;

a second pixel row adjacent to the first pixel row, the second pixel row including a second plurality of first pixels and a plurality of third pixels configured to sense third wavelength light, the second plurality of first pixels and the plurality of third pixels being alternately arranged, the third wavelength light having a third wavelength; and a plurality of first color separation elements in the plurality of second pixels, respectively, the plurality of first color separation elements configured to change a spectrum distribution of incident light such that a ratio of the second wavelength light to light incident on the plurality of second pixels and a ratio of the first wavelength light to light incident on at least one of the first and second pluralities of first pixels increase; and a plurality of second color separation elements in the second plurality of first pixels in the second pixel row, respectively, the plurality of second color separation elements configured to change the spectrum distribution of incident light such that the ratio of the first wavelength light to light incident on the at least one of the first and second pluralities of first pixels and a ratio of the third wavelength light to light incident on the plurality of third pixels increase, wherein the first pixels of the first pixel row and the first pixels of the second pixel row are configured to sense light having the same wavelength band, and there is no color separation element in the first pixels of the first pixel row and in the third pixels of the second pixel row.

20. The image sensor of claim 19, further comprising a plurality of first microlenses disposed with respect to the second pixels and extend on areas of portions of the first pixels that are on two sides of the second pixels and a plurality of second microlenses disposed with respect to the first pixels and extend on areas of portions of the third pixels that are on two sides of the first pixels.

* * * * *